(12) United States Patent
Cho et al.

(10) Patent No.: US 10,586,714 B2
(45) Date of Patent: Mar. 10, 2020

(54) THIN FILM TRANSISTOR SUBSTRATE, LIQUID CRYSTAL DISPLAY PANEL HAVING THE SAME AND METHOD OF MANUFACTURING THE SAME

(71) Applicant: Samsung Display Co., Ltd., Yongin, Gyeonggi-Do (KR)

(72) Inventors: Hyun-Min Cho, Asan-si (KR); Dong-Il Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 715 days.

(21) Appl. No.: 14/752,267

(22) Filed: Jun. 26, 2015

(65) Prior Publication Data

US 2016/0005616 A1    Jan. 7, 2016

(30) Foreign Application Priority Data

Jul. 4, 2014   (KR) .................. 10-2014-0083991

(51) Int. Cl.
*H01L 21/311*     (2006.01)
*H01L 21/3213*    (2006.01)
*H01L 21/467*     (2006.01)
*H01L 27/12*      (2006.01)
*H01L 29/66*      (2006.01)
(Continued)

(52) U.S. Cl.
CPC ........ *H01L 21/467* (2013.01); *H01L 27/1288* (2013.01); *H01L 29/66765* (2013.01); *H01L 29/66969* (2013.01); *G02F 1/1368* (2013.01); *H01L 29/7869* (2013.01); *H01L 29/78669* (2013.01); *H01L 29/78678* (2013.01)

(58) Field of Classification Search
CPC ............... H01L 21/3086; H01L 29/786; H01L 29/6675; H01L 21/31133; H01L 21/32139; H01L 21/31144
See application file for complete search history.

(56) References Cited

U.S. PATENT DOCUMENTS 5,882,535 A   3/1999   Stocks et al.
6,376,383 B2  4/2002   Mitsuiki
(Continued)

FOREIGN PATENT DOCUMENTS

JP    2009-206401 A   9/2009
KR   10-2010-0050131 A   5/2010
(Continued)

*Primary Examiner* — Thomas T Pham
(74) *Attorney, Agent, or Firm* — H.C. Park & Associates, PLC (57) ABSTRACT

A thin film transistor substrate includes a gate electrode arranged on a substrate, a gate insulation layer arranged on the gate electrode, an active pattern arranged on the gate insulation layer, a source electrode overlapping a first end portion of the active pattern, and a drain electrode overlapping a second and opposite end portion of the active pattern. A fluorocarbon-like material is arranged on one or more of surfaces of at least one of the active pattern, the source electrode and the drain electrode, and on a photoresist pattern used in the formation process of the thin film substrate. The fluorocarbon-like material on the photoresist pattern serves to maintain a shape and size of the photoresist pattern during subsequent patterning processes.

5 Claims, 12 Drawing Sheets

(51) Int. Cl.
    *G02F 1/1368*    (2006.01)
    *H01L 29/786*    (2006.01)

(56)                References Cited

U.S. PATENT DOCUMENTS

| | | | |
|---|---|---|---|
| 8,021,937 B2 * | 9/2011 | Roh | H01L 27/1288 |
| | | | 257/E21.414 |
| 8,262,920 B2 | 9/2012 | Pandhumsoporn et al. | |
| 2004/0134878 A1 * | 7/2004 | Matsushita | G02F 1/13458 |
| | | | 216/23 |
| 2004/0169812 A1 * | 9/2004 | Kim | G02F 1/136209 |
| | | | 349/187 |
| 2009/0221148 A1 | 9/2009 | Uda et al. | |

FOREIGN PATENT DOCUMENTS

| | | |
|---|---|---|
| KR | 10-2011-0004075 A | 1/2011 |
| KR | 10-2012-0120588 A | 11/2012 |

\* cited by examiner

THIN FILM TRANSISTOR SUBSTRATE, LIQUID CRYSTAL DISPLAY PANEL HAVING THE SAME AND METHOD OF MANUFACTURING THE SAME

CLAIM OF PRIORITY

This application claims priority under 35 U.S.C. § 119 to Korean Patent Application No. 10-2014-0083991, filed on Jul. 4, 2014, the disclosure of which is incorporated by reference herein in its entirety.

BACKGROUND OF THE INVENTION

Field of the Invention

Exemplary embodiments of the inventive concept relate to a thin film transistor substrate capable of improving reliability, a liquid crystal display panel having the thin film transistor substrate, and a method of manufacturing the thin film transistor substrate.

Description of the Related Art

Generally, a liquid crystal display apparatus has a liquid crystal layer arranged between an array substrate and an opposite substrate, the liquid crystal layer including a plurality of liquid crystals. The liquid crystal display apparatus also has a light source, such as a backlight unit, to apply light to a liquid crystal display panel. Light from the light source is applied to the liquid crystal display panel that includes the array substrate, the opposite substrate and the liquid crystal layer. The liquid crystal display apparatus displays an image by controlling amount of light that passes the substrates according to an alignment of liquid crystals.

The array substrate may include a plurality of pixels, a plurality of switching elements, such as thin film transistors, that are electrically connected to the pixels, and gate and data lines electrically connected to the switching elements. Each of the thin film transistors may have a bottom gate structure. The thin film transistors of the bottom gate structure may be formed by patterning a metal layer using a photoresist pattern.

For example, in a four mask manufacturing process having four different mask processes, a photoresist pattern is partially removed by ashing process, so that source and drain electrode of the thin film transistors may be formed. However, during the ashing process of the photoresist pattern, an under-cut may occur at ends of the photoresist pattern due to an over process, and the under-cut may influence the patterning and the final design of the thin film transistors.

SUMMARY OF THE INVENTION

One or more exemplary embodiments of the inventive concept provide a thin film transistor substrate capable of improving reliability.

One or more exemplary embodiments of the inventive concept also provide a liquid crystal display panel including the thin film transistor substrate.

One or more exemplary embodiments of the inventive concept also provide a method of manufacturing the thin film transistor substrate.

According to one aspect of the present invention, there is provided a thin film transistor substrate, including a base substrate, a gate electrode arranged on the base substrate, gate insulation layer arranged on the gate electrode, an active pattern arranged on the gate insulation layer, a source electrode overlapping a first end portion of the active pattern and a drain electrode overlapping a second and opposite end portion of the active pattern, wherein a fluorocarbon-like material may be arranged on one or more of surfaces of at least one element selected from a group consisting of the active pattern, the source electrode and the drain electrode. The fluorocarbon-like material may be arranged on a portion of an upper surface of the active pattern. The fluorocarbon-like material may be arranged on a portion of a side surface of the active pattern. The fluorocarbon-like material may be arranged in a side of at least one of the source and the drain electrodes. The fluorocarbon-like material may include $CnF_{2n-k}$ (n being a natural number, k being natural number less than 2n) or $CHF_3$.

According to another aspect of the present invention, there is provided a liquid crystal display panel, including an array substrate, an opposite substrate and a liquid crystal layer arranged between the array substrate and the opposite substrate, wherein the array substrate may include a gate line extending in a first direction, a data line crossing the gate line and a switching element electrically connected to the gate line and the data line, wherein a fluorocarbon-like material is arranged at a portion of the switching element. The switching element may include a gate electrode electrically connected to the gate line, an active pattern overlapping the gate electrode, a source electrode overlapping a first end of the active pattern and a drain electrode overlapping a second and opposite end of the active pattern, the fluorocarbon-like material may be arranged on at least one of surfaces of the active pattern, the source electrode and the drain electrode. The fluorocarbon-like material may be arranged on an upper surface of the active pattern. The fluorocarbon-like material may be arranged on a portion of a side surface of the active pattern. The fluorocarbon-like material may be arranged on at least of a side surface of the source or drain electrode.

According to yet another aspect of the present invention, there is provided a method of manufacturing a thin film transistor substrate, including providing a base substrate, forming a gate electrode on the base substrate, forming a gate insulation layer on the gate electrode, sequentially forming an active layer and a data metal layer on the gate insulation layer, forming a first photoresist pattern on the data metal layer, forming a data metal pattern by patterning the data metal layer by using the first photoresist pattern as an etch mask, performing a pre-process treatment on the data metal pattern using a fluorocarbon-like plasma and forming an active pattern by pattering the active layer using the first photoresist pattern as an etch mask. The fluorocarbon-like plasma produces a fluorocarbon-like material that comprises $CnF_{2n-k}$ (where both n and k are natural numbers, with 2n–>0) or $CHF_3$. The method may also include forming a second photoresist pattern by partially removing the first photoresist pattern and forming source and drain electrodes by patterning the data metal pattern using the second photoresist pattern as an etch mask. The fluorocarbon-like material may be included on a surface of a portion of the active pattern. The fluorocarbon-like material may be included on at least a side surface of the source and drain electrodes.

According to yet another aspect of the present invention, there is provided a method of manufacturing a thin film transistor substrate, including providing a base substrate, forming a gate electrode on the base substrate, forming a gate insulation layer on the gate electrode, sequentially forming an active layer and a data metal layer on the gate insulation layer, forming a first photoresist pattern on the data metal layer, forming a data metal pattern by patterning the data metal layer by using the first photoresist pattern as an etch mask, forming an active pattern by patterning the active layer by using the first photoresist pattern as an etch mask and performing a pre-process plasma treatment on the thin film transistor substrate on which the active pattern is formed by exposing the thin film transistor substrate to a fluorocarbon-like plasma. The fluorocarbon-like plasma may produce a fluorocarbon-like material that comprises $CnF_{2n-k}$ (where n is a natural number and k is a natural number less than 2n) or $CHF_3$. The method may also include forming a second photoresist pattern by partially removing the first photoresist pattern and forming source and drain electrodes by patterning the data metal pattern using the second photoresist pattern as an etch mask. Some of the fluorocarbon-like material may remain on a surface of a portion of at least one of the active pattern, the source electrode and the drain electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the inventive concept will be explained in detail with reference to the accompanying drawings.

Figure 1:
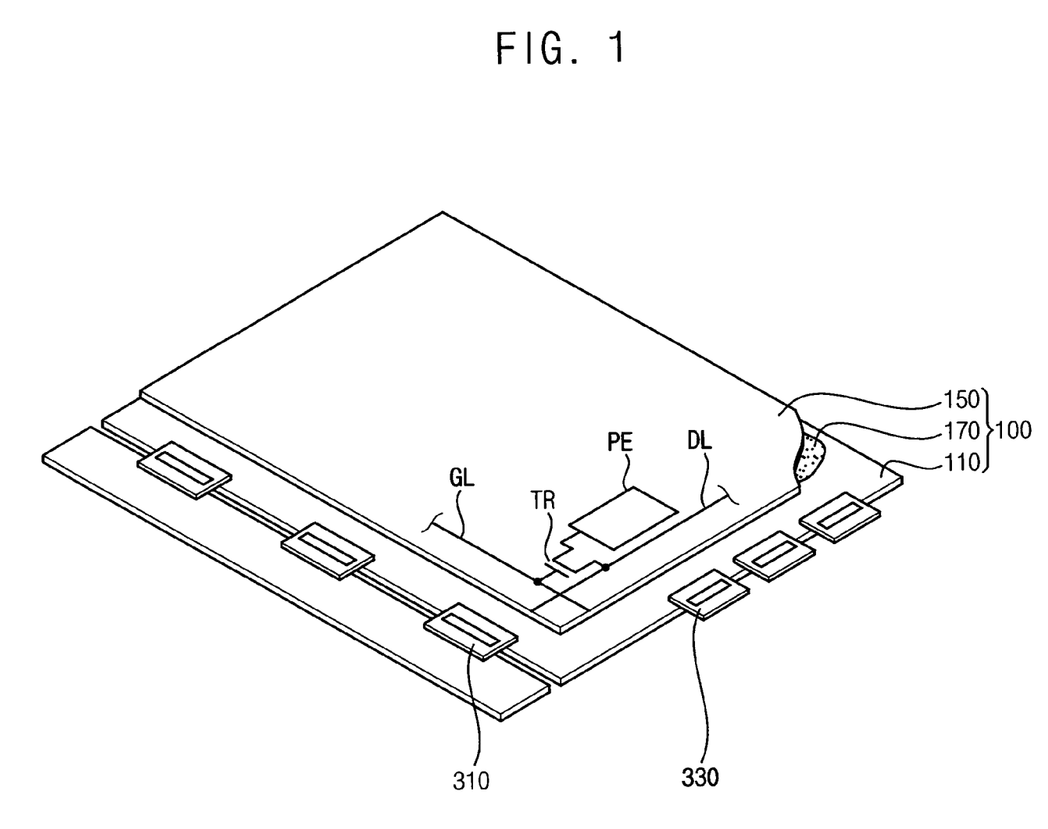
FIG. 1 is a perspective view illustrating a liquid crystal display panel according to an exemplary embodiment of the present invention.
Figure 2:
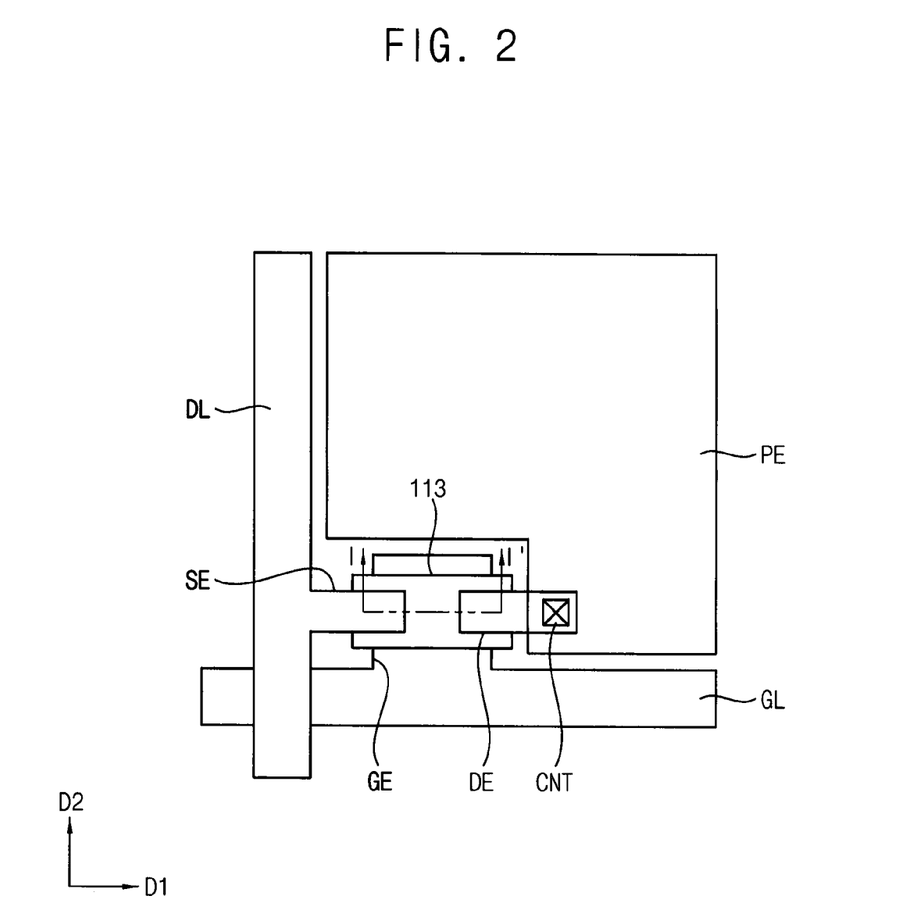
FIG. 2 is an enlarged plan view partially illustrating the liquid crystal display panel of FIG. 1.

Turning now to FIGS. 1 and 2, FIG. 1 is a perspective view illustrating a liquid crystal display panel according to an exemplary embodiment of the present invention and FIG. 2 is an enlarged plan view partially illustrating the liquid crystal display panel of FIG. 1. In FIGS. 1 and 2, a liquid crystal display panel 100 includes a first substrate 110, a second substrate 150 and a liquid crystal layer 170, the liquid crystal display panel 100 being electrically connected to a driving part 300, the driving part 300 may include a gate driving part 330 and a data driving part 310.

The first substrate 110 includes a plurality of gate lines GL, a plurality of data lines DL, a plurality of switching elements TFT and a plurality of pixel electrodes PE. The gate lines GL may extend in a first direction D1, and be arranged in a second direction D2 that crosses the first direction D1. The data lines DL may extend in the second direction D2, and be arranged in the first direction D1. Each switching element TFT may include a gate electrode GE, a source electrode SE, an active pattern 113 and a drain electrode DE, and each switching element TFT may be connected to one of the gate lines GL, one of the data lines DL, and one of the pixel electrodes PE.

The second substrate 150 may face the first substrate 110. The liquid crystal layer 170 may be arranged between the first substrate 110 and the second substrate 150. The second substrate 150 may include a color filter. On the other hand, the color filter may be arranged on the first substrate 110. In addition, the second substrate 150 may include a pixel common electrode to form a vertical electric field (i.e. in a thickness direction of the display device) with the pixel electrode PE arranged on the first substrate 110. Alternatively, the pixel common electrode may be arranged on the first substrate 110 to form a horizontal electric field (i.e. parallel to a plane of the substrates) with the pixel electrode PE. A slit pattern may be defined in the pixel electrode PE or in the pixel common electrode.

Figure 3:
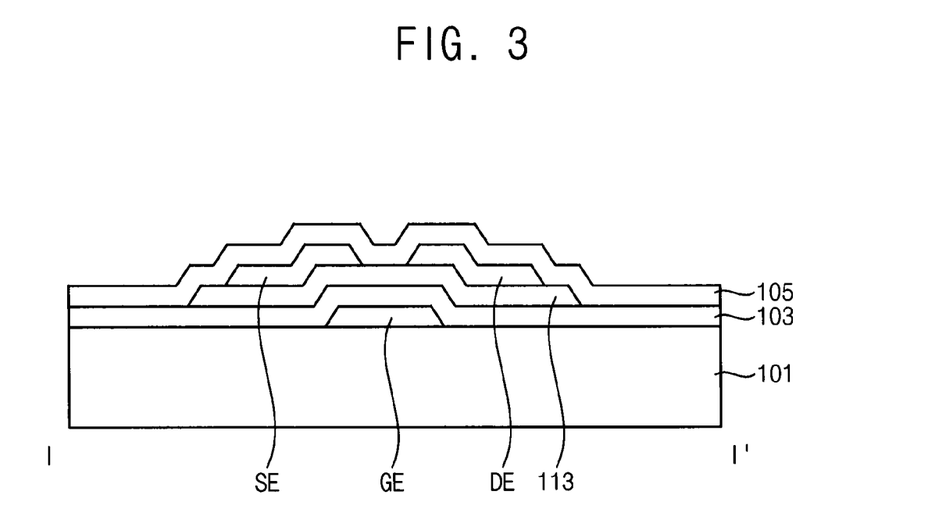
FIG. 3 is a cross-sectional view taken along a line I-I' of FIG. 2.

Turning now to FIG. 3, FIG. 3 is a cross-sectional view taken along a line I-I' of FIG. 2. Referring to FIGS. 2 and 3, the first substrate 110 includes a base substrate 101, a gate electrode GE, a gate line GL, a gate insulation layer 103, an active pattern 113, a source electrode SE, a drain electrode DE, a data line DL, an insulation layer 105, a pixel electrode PE. The base substrate 101 includes a transparent insulating material, such as glass, quartz, and/or plastic. For example, the base substrate 101 may include polyethylene terephthalate resin, polyethylene resin, polycarbonate resin and the like.

The gate electrode GE is arranged on the base substrate 101. The gate electrode GE may be electrically connected to the gate line GL. A gate signal from the gate driving part 330 may be applied to the gate electrode GE. The gate electrode GE may include aluminum (Al), titanium (Ti), copper (Cu), molybdenum (Mo), tantalum (Ta), tungsten (W), neodymium (Nd), chrome (Cr), silver (Ag), copper oxide (CuOx) and etc. In addition, the gate electrode GE may include gallium doped zinc oxide (GZO), indium doped zinc oxide (IZO), and/or copper-manganese (CuMn) and etc.

The gate insulation layer 103 is arranged on the base substrate 101 on which the gate electrode GE is formed. The gate insulation layer 103 may include transparent insulating material such as silicon oxide ($SiO_x$), silicon nitride ($SiN_x$) and etc.

The active pattern 113 may be arranged on the gate insulation layer 103. At least a portion of the active pattern 113 may overlap the gate electrode GE. The active pattern 113 may include indium (In), zinc (Zn), gallium (Ga), tin (Sn), hafnium (Hf) and the like. For example, the active pattern 113 may be an oxide semiconductor pattern including indium gallium zinc oxide (IGZO), indium tin zinc oxide (ITZO), hafnium indium zinc oxide (HIZO) and etc, or may instead include a silicon based material like polysilicon or amorphous silicon.

A residual fluorocarbon-like component may also be included on a portion of the active pattern 113. For example, the fluorocarbon-like component may be arranged on a portion of an upper surface of the active pattern 113, or on a portion of a side surface of the active pattern 113. The fluorocarbon-like component may include CF-like gas group. For example, the fluorocarbon-like component may include $CnF_{2n-k}$ (where n is natural number and k is natural number less than 2n) or $CHF_3$. For example, the fluorocarbon-like component may include $C_4F_8$, $C_4F_6$, $CHF_3$, etc. The fluorocarbon-like component that is arranged on a portion of the active pattern 113 will be described in detail later in conjunction with FIGS. 4D and 5F.

The source electrode SE is arranged on the gate insulation layer 103 to overlap a first end of the active pattern 113. The source electrode SE may be electrically connected to the data line DL. Data voltage may be applied to the source electrode SE from the data driving part 310. The source electrode SE may include aluminum (Al), titanium (Ti), copper (Cu), molybdenum (Mo), tantalum (Ta), tungsten (W), neodymium (Nd), chrome (Cr), silver (Ag) and etc. The source electrode SE may also include the fluorocarbon-like component at a surface of the source electrode SE. For example, the fluorocarbon-like component may be arranged on a side surface of the source electrode SE that faces away from the drain electrode DE.

The drain electrode DE is spaced apart form source electrode SE. The drain electrode DE is arranged on the gate insulation layer 103 to overlap a second and opposite end of the active pattern 113. The drain electrode DE may include aluminum (Al), titanium (Ti), copper (Cu), molybdenum (Mo), tantalum (Ta), tungsten (W), neodymium (Nd), chrome (Cr), silver (Ag) and etc. In addition, the fluorocarbon-like component may be arranged on a side surface of the drain electrode DE that faces away from the source electrode SE.

The insulation layer 105 is arranged on the base substrate 101 on which the source electrode SE and the drain electrode DE are formed. The insulation layer 105 may include same material as that of the gate insulation layer 103.

The pixel electrode PE is arranged in the insulation layer 105 and is electrically connected to the drain electrode DE through a contact hole CNT that perforates the insulation layer 105. The pixel electrode PE may include a transparent conductive material, such as indium zinc oxide (IZO), indium tin oxide (ITO), tin oxide ($SnO_x$), zinc oxide ($ZnO_x$) and etc.

Figure 4A:
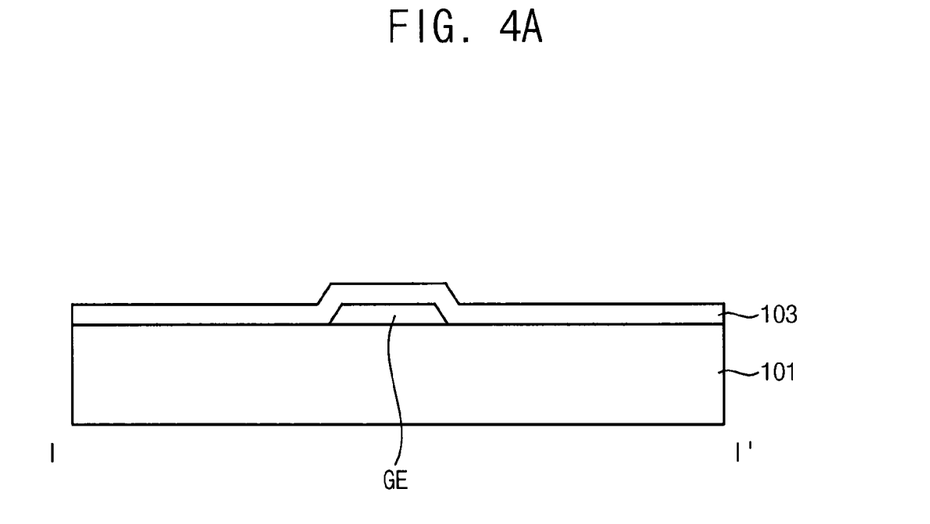
FIGS. 4A to 4I are cross-sectional views illustrating a method of manufacturing a thin film transistor substrate according to a first exemplary embodiment of the present invention.

Turning now to FIGS. 4A to 4I, FIGS. 4A to 4I are cross-sectional views illustrating a method of manufacturing a thin film transistor substrate according to a first exemplary embodiment of the present invention. Referring now to FIG. 4A, in the method of manufacturing the thin film transistor substrate, a gate electrode GE is formed on a base substrate 101. The gate electrode GE may include aluminum (Al), titanium (Ti), copper (Cu), molybdenum (Mo), tantalum (Ta), tungsten (W), neodymium (Nd), chrome (Cr), silver (Ag), copper oxide ($CuO_x$) and etc.

A gate insulation layer 103 is then formed on the base substrate 101 on which the gate electrode GE is formed. The gate insulation layer 103 may include a transparent insulative material such as silicon oxide ($SiO_x$), silicon nitride ($SiN_x$) and etc.

Figure 4B:
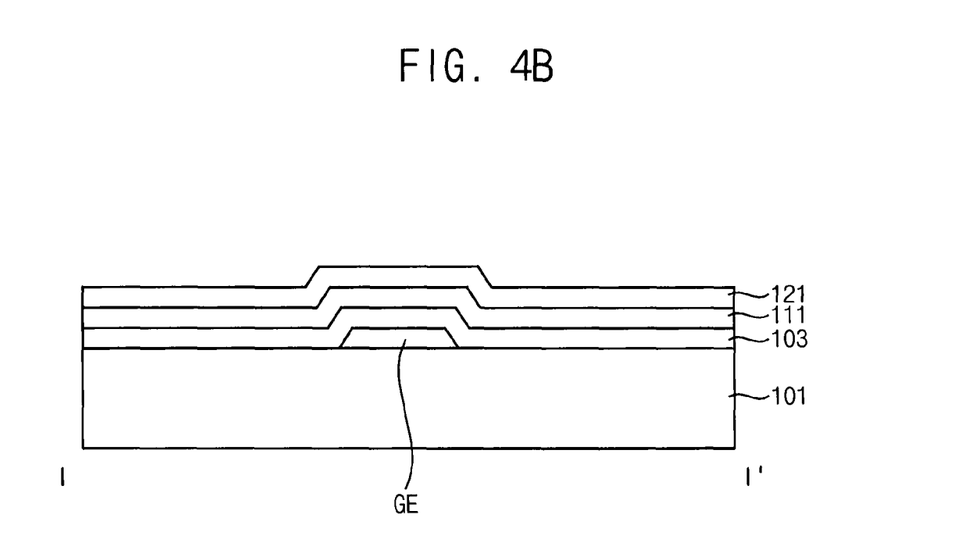

Referring now to FIG. 4B, an active layer 111 is formed on the gate insulation layer 103. The active layer 111 may include indium (In), zinc (Zn), gallium (Ga), tin (Sn), hafnium (Hf) and etc. For example, the active layer 111 may be an oxide semiconductor layer including indium gallium zinc oxide (IGZO), indium tin zinc oxide (ITZO), hafnium indium zinc oxide (HIZO) and etc.

A data metal layer 121 is then formed on the active layer 111. The data metal layer 121 may include aluminum (Al), titanium (Ti), copper (Cu), molybdenum (Mo), tantalum (Ta), tungsten (W), neodymium (Nd), chrome (Cr), silver (Ag) and etc.

Figure 4C:
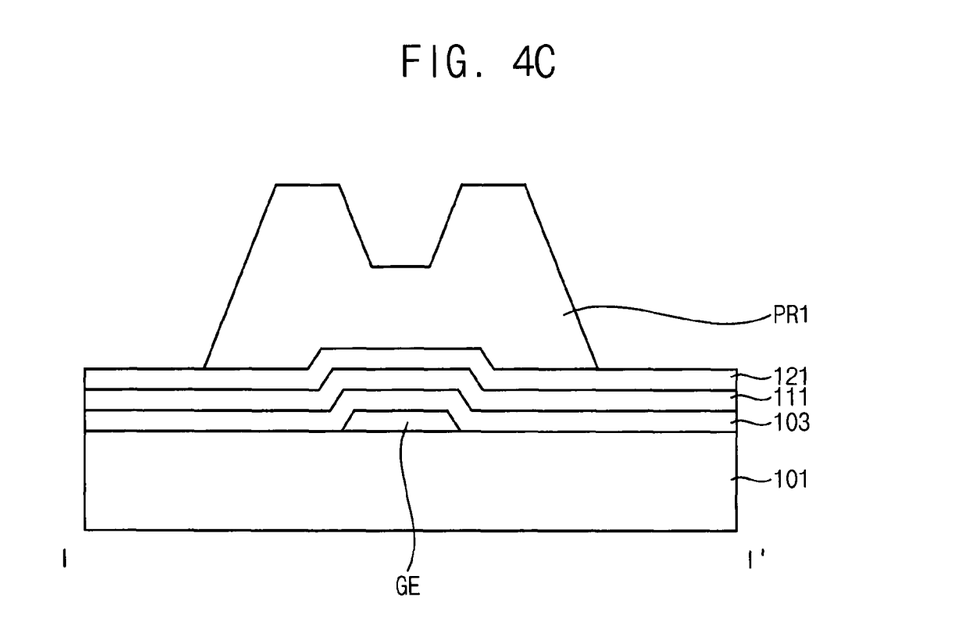

Referring now to FIG. 4C, a first photoresist pattern PR1 is formed on the data metal layer 121 at a location that overlaps the gate electrode GE. The first photoresist pattern PR1 may have a smaller thickness at a portion that overlaps the gate electrode than at remaining portions.

Figure 4D:
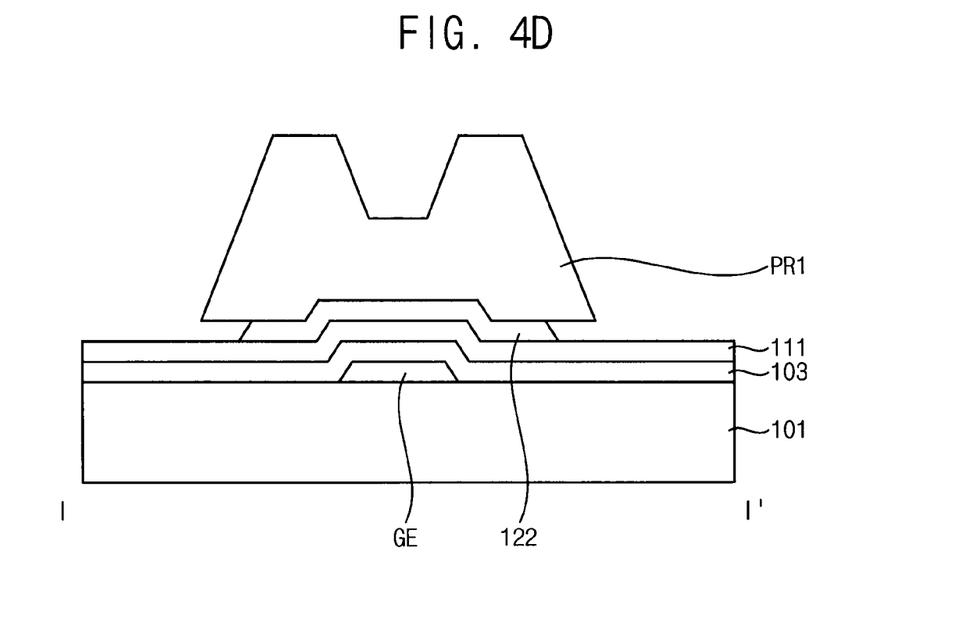

Referring now to FIG. 4D, the data metal layer 121 is etched while using the first photoresist pattern PR1 as an etch mask, so that a data metal pattern 122 may be formed on the active layer 111. For example, the data metal layer 121 may be wet-etched using the first photoresist pattern PR1 as an etch mask. In this case, an outline of the data metal pattern 122 may be formed inside of an outline of the first photoresist pattern PR1 due to an undercutting that occurs during the wet-etch process.

Figure 4E:
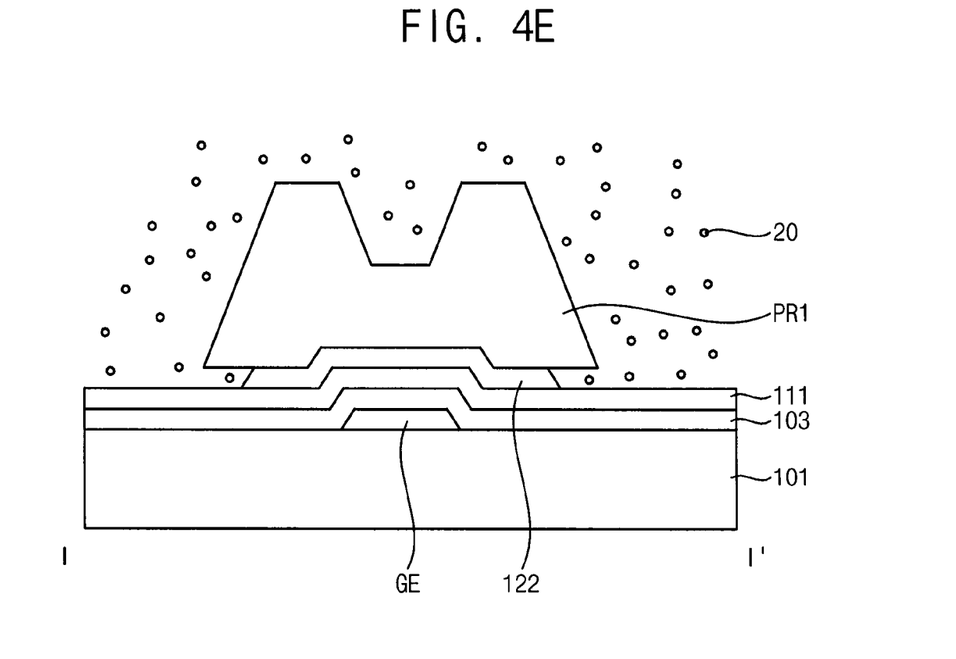

Referring now to FIG. 4E, pre-process treatment using fluorocarbon-like plasma 20 is performed on the base substrate 101 on which the data metal pattern 122 is formed. The fluorocarbon-like plasma 20 may include CF-like plasma, such as $CnF_{2n-k}$ (where n and k are natural numbers, and 2n–k>0) or $CHF_3$. For example, the fluorocarbon-like plasma 20 may include $C_4F_8$, $C_4F_6$, $CHF_3$, or the like.

Portions of the upper surface of the active layer 111 that are not covered by the data metal pattern 122 may be treated by the pre-process treatment using the fluorocarbon-like plasma 20, so that a layer comprised of the same fluorocarbon-like material used in the plasma is formed thereon. In addition, side surfaces of the data metal pattern 122 that are not covered by the first photoresist pattern PR1 or the active layer 111 may be treated by the pre-process treatment using the fluorocarbon-like plasma 20, so that a layer comprised of the same fluorocarbon-like material used in the plasma is formed thereon. In addition, an exposed portion of the first photoresist pattern PR1 may be treated by the pre-process treatment using the fluorocarbon-like plasma 20, so that a layer comprised of the same fluorocarbon-like material used in the plasma is formed thereon.

Figure 4F:
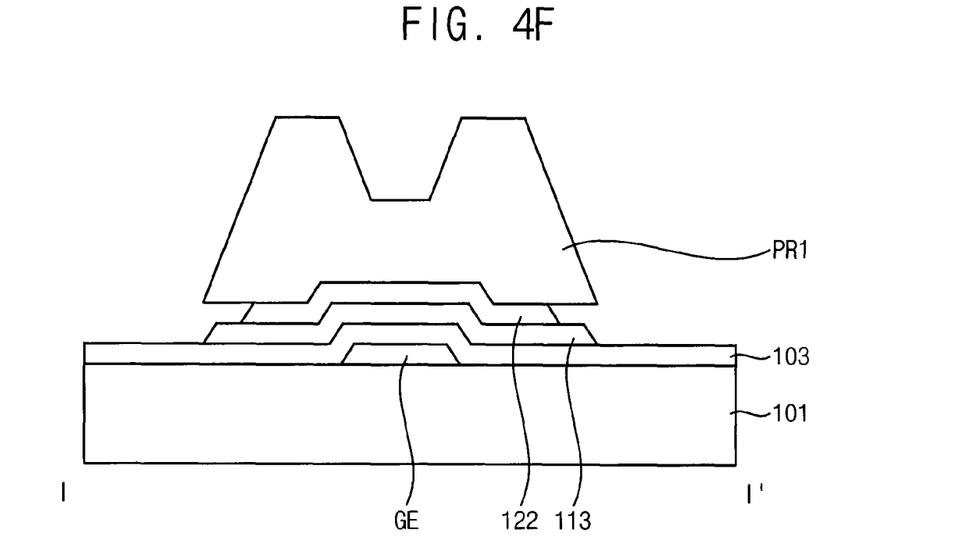

Referring now to FIG. 4F, the exposed portions of the active layer 111 are removed by the fluorocarbon-like plasma 20 using the first photoresist pattern PR1 as an etch mask. An active pattern 113 may result by removing the exposed portions of the active layer 111. An outline of the active pattern 113 may be substantially same as an outline of the first photoresist pattern PR1, and consequently may be formed outside of the outline of the data metal pattern 122.

In portions of an upper surface of the active pattern 113 near the outline of the active pattern 113 that are not covered by the data metal pattern 122, the fluorocarbon-like component may remain due to the pre-process treatment using the fluorocarbon-like plasma 20. Also, at both side surfaces of the data metal pattern 122 that are not covered by the first photoresist pattern PR1, the fluorocarbon-like component may remain due to the pre-process treatment using the fluorocarbon plasma 20. In each case, this fluorocarbon-like component may include $C_4F_8$, $C_4F_6$, $CHF_3$, or the like, and may be the same as the fluorocarbon-like material used in the plasma pre-process treatment.

Figure 4G:
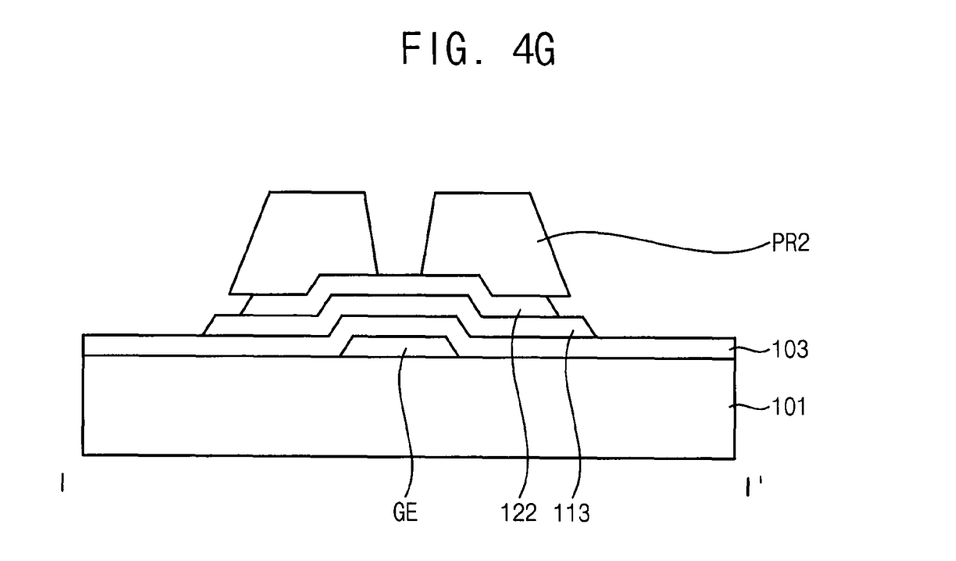

Referring now to FIG. 4G, a second photoresist pattern PR2 is formed by partially removing the first photoresist pattern PR1. The second photoresist pattern PR2 may be formed by partially removing the first photoresist pattern PR1 in a thickness direction. This can be achieved by an ashing technique, such as an oxygen plasma etch. As a result, an upper surface of the data metal pattern 122 may be partially exposed by the second photoresist pattern PR2. More specifically, a central portion of the upper surface of the data metal pattern 122 may be exposed as a result of the ashing process.

An outline of the second photoresist pattern PR2 may be maintained outside of the outline of the data metal pattern 122. Generally, in an ashing process of the first photoresist pattern PR1, an outline of the second photoresist pattern PR2 may be moved and an under-cut may be formed in the second photoresist pattern PR2. However, according to the present example embodiment, since the first photoresist pattern PR1 has already been subjected to the pre-process treatment using the fluorocarbon-like plasma 20, the outline of the second photoresist pattern PR2 may be maintained.

Figure 4H:
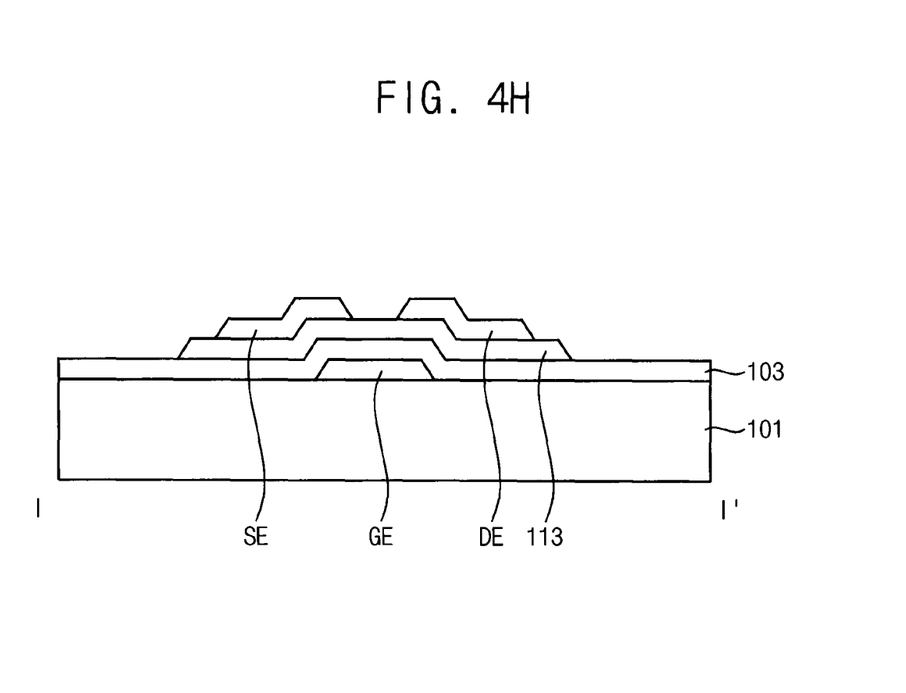

Referring now to FIG. 4H, the data metal pattern 122 is etched using the second photoresist pattern PR2 as an etch mask. An exposed portion of the data metal pattern 122 is etched, so that source and drain electrodes SE and DE may be formed. An outline of the second photoresist pattern PR2 may be maintained during this etching process, so that the source electrode SE and the drain electrode DE having a proper width and a proper skewness may be formed. Subsequent to the patterning of the data metal pattern 122 to produce the source and drain electrodes SE and DE, the second photoresist pattern PR2 is removed altogether by another ashing process, to achieve the structure illustrated in FIG. 4H.

Figure 4I:
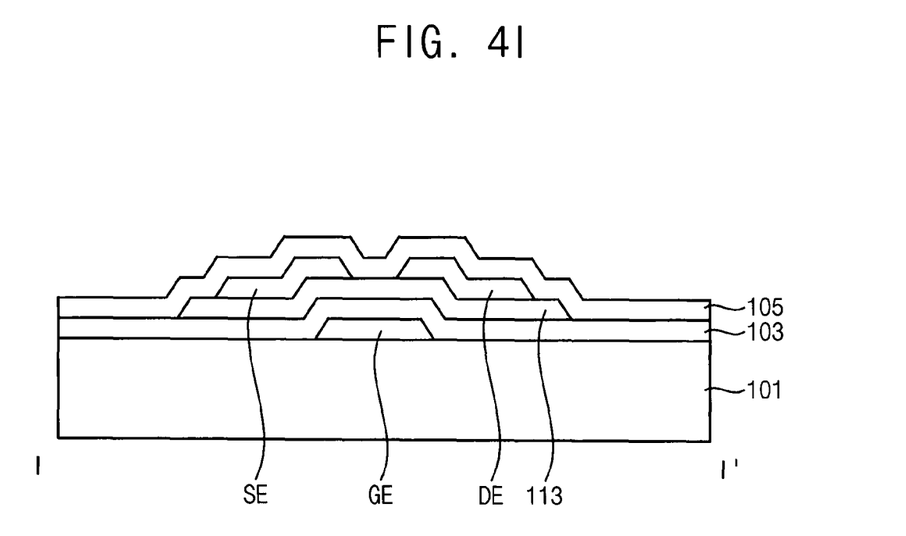

Referring now to FIG. 4I, an insulation layer 105 is formed on the base substrate 101 on which the source electrode SE and the drain electrode DE are formed to complete the method of making. The insulation layer 105 may generally cover the source electrode SE and the drain electrode DE.

Figure 5A:
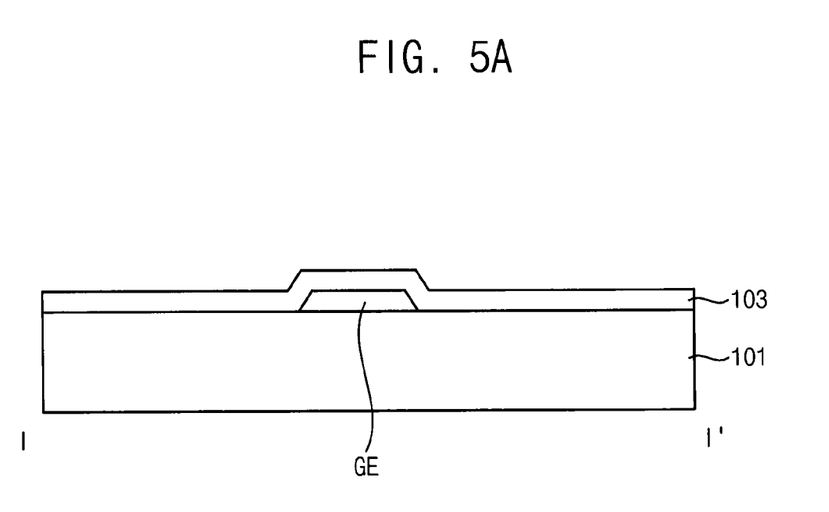
FIGS. 5A to 5I are cross-sectional views illustrating another method of manufacturing a thin film transistor substrate according to a second exemplary embodiment of the present invention.

Turning now to FIGS. 5A to 5I, FIGS. 5A to 5I are cross-sectional views illustrating a method of manufacturing a thin film transistor substrate according to a second exemplary embodiment of the present invention. Referring now to FIG. 5A, in the method of manufacturing the thin film transistor substrate, a gate electrode GE is formed on a base substrate 101. The gate electrode GE may include aluminum (Al), titanium (Ti), copper (Cu), molybdenum (Mo), tantalum (Ta), tungsten (W), neodymium (Nd), chrome (Cr), silver (Ag), copper oxide ($CuO_x$) and etc. The gate electrode GE may also include gallium doped zinc oxide (GZO), indium doped zinc oxide (IZO), copper-manganese alloy (CuMn) and etc.

A gate insulation layer 103 is formed on the base substrate 101 on which the gate electrode GE is formed. The gate insulation layer 103 may include a transparent insulative material such as silicon oxide ($SiO_x$), silicon nitride ($SiN_x$) and etc.

Figure 5B:
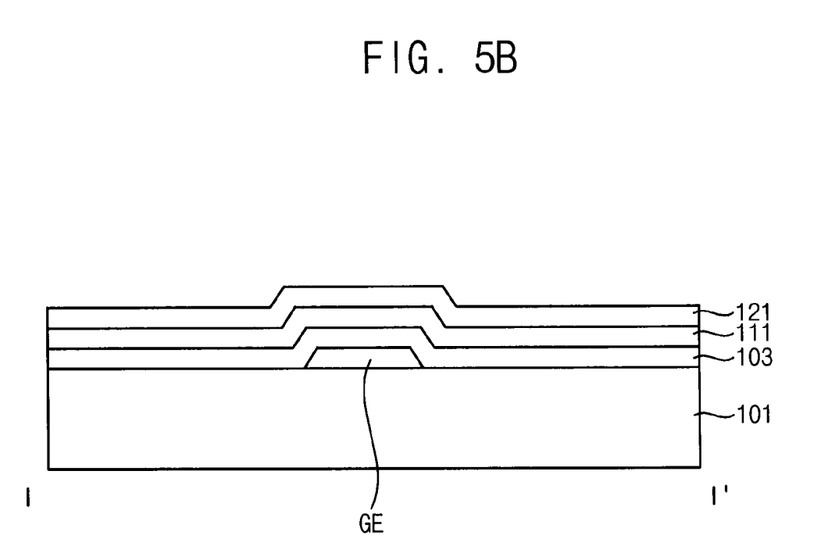

Referring now to FIG. 5B, an active layer 111 is formed on the gate insulation layer 103. The active layer 111 may include indium (In), zinc (Zn), gallium (Ga), tin (Sn), hafnium (Hf) and etc. For example, the active layer 111 may be an oxide semiconductor layer including indium gallium zinc oxide (IGZO), indium tin zinc oxide (ITZO), hafnium indium zinc oxide (HIZO) and etc, or may include polysilicon or amorphous silicon.

A data metal layer 121 is then formed on the active layer 111. The data metal layer 121 may include aluminum (Al), titanium (Ti), copper (Cu), molybdenum (Mo), tantalum (Ta), tungsten (W), neodymium (Nd), chrome (Cr), silver (Ag) and etc.

Figure 5C:
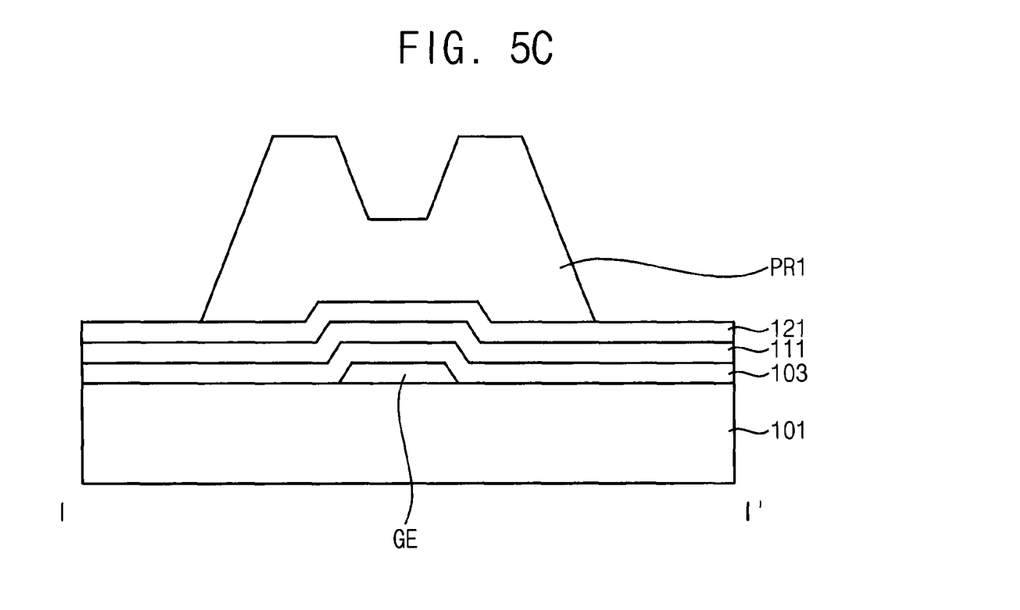

Referring now to FIG. 5C, a first photoresist pattern PR1 is formed on the data metal layer 121. The first photoresist pattern PR1 may overlap the gate electrode GE, and may have a smaller thickness at a center portion that overlaps the gate electrode than at other portions.

Figure 5D:
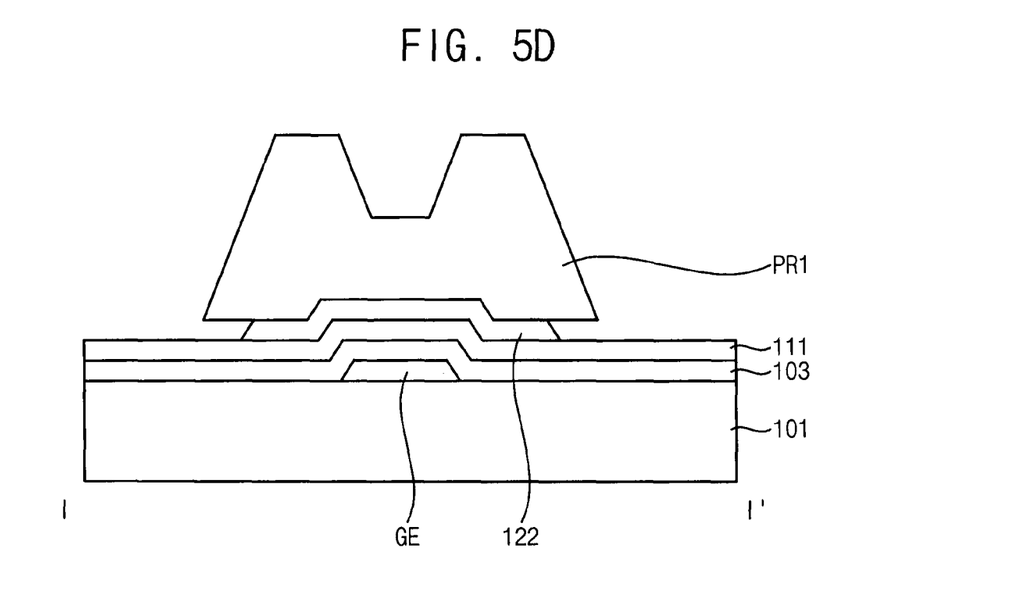

Referring now to FIG. 5D, the data metal layer 121 is etched using the first photoresist pattern PR1 as an etch mask, so that a data metal pattern 122 may be formed on the active layer 111. For example, the data metal layer 121 may be wet-etched using the first photoresist pattern PR1 as an etch mask. In this case, outline of the data metal pattern 122 may be formed inside of outline of the first photoresist pattern PR1 due to an undercut in the data metal pattern 122 caused by the wet-etching process.

Figure 5E:
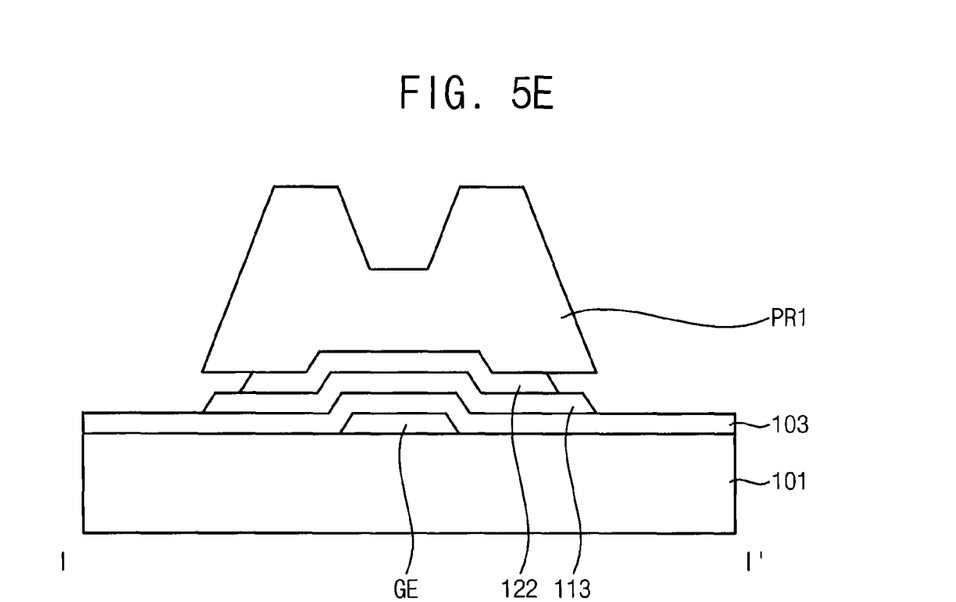

Referring now to FIG. 5E, an exposed portion of the active layer 111, previously exposed by the etching of the data metal layer 121, is removed using the first photoresist pattern PR1 as an etch mask. In other words, and unlike the first embodiment of FIGS. 4A to 4I, the second embodiment of FIGS. 5A to 5I patterns the active layer 111 prior to when the preprocess treatment of the fluorocarbon-like plasma occurs. In FIG. 5E, this etching of active layer 111 to produce active pattern 113 is called 'etch back', and may be achieved by a dry etch or a plasma etch. The result is an active pattern 113 arranged on the gate insulation layer 103 upon removal of the exposed portion of the active layer 111. An outline of the active pattern 113 may be substantially same as an outline of the first photoresist pattern PR1, and may be formed to extend outside of an outline of the data metal pattern 122.

Figure 5F:
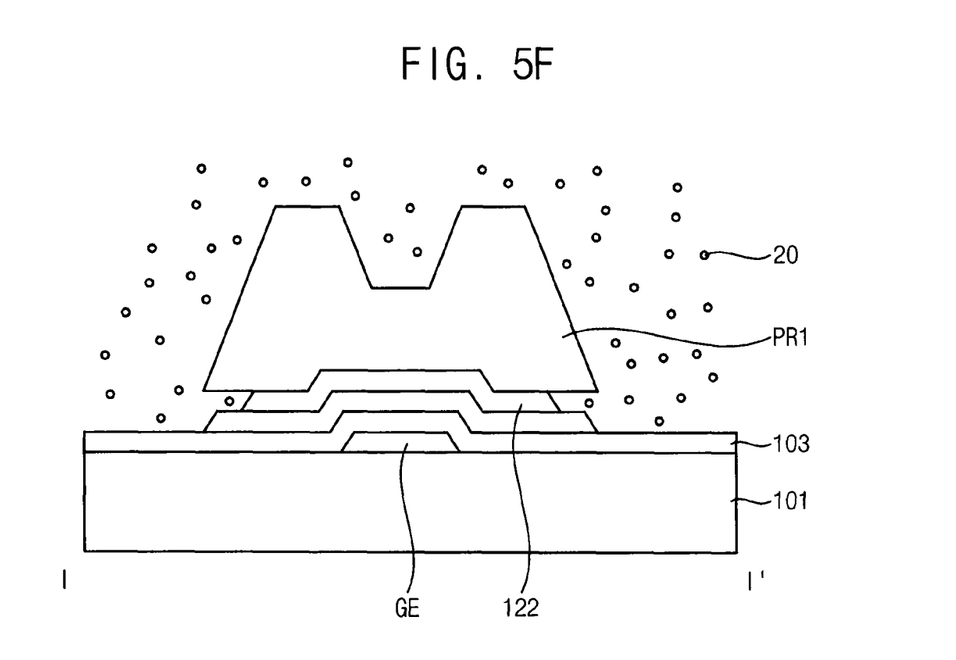

Referring now to FIG. 5F, pre-process treatment using a fluorocarbon-like plasma 20 is performed on the base substrate 101 on which the active pattern 113 is formed. The fluorocarbon-like plasma 20 may include CF-like plasma, such as $CnF_{2n-k}$ (where n is natural number, and k is natural number smaller than 2n), or $CHF_3$. For example, the fluorocarbon-like plasma 20 may include $C_4F_8$, $C_4F_6$, $CHF_3$, or the like. As a result, upper and side surfaces of the active pattern 113 that are not covered by the data metal pattern 122 may be treated by the fluorocarbon-like plasma 20, and therefore a layer of the same fluorocarbon-like material used in the pre-process plasma treatment may be formed on the upper and side surfaces of active pattern 113 that are not covered by the data metal pattern 122 as a result of the pre-process plasma treatment. This layer may therefore include $C_4F_8$, $C_4F_6$, $CHF_3$ and the like. In addition, an exposed portion of the first photoresist pattern PR1 may also be treated by the fluorocarbon-like plasma 20, as well as side surfaces of the data metal layer 121 that are not covered by the first photoresist pattern PR1 or the active layer 111. Consequently, a layer of the same fluorocarbon-like material used in the pre-process plasma treatment may also be formed on the exposed portion of the first photoresist pattern PR1, as well as side surfaces of the data metal layer 121 that are not covered by the first photoresist pattern PR1 or the active layer 111 as a result of the pre-process plasma treatment.

As a result of the pre-process treatment using the fluorocarbon-like plasma 20, the fluorocarbon-like layer may remain in side and upper surfaces of the active pattern 113 near the outline that are not covered by the data metal pattern 122, and may therefore include $C_4F_8$, $C_4F_6$, $CHF_3$ and the like. Likewise, and also as a result of the pre-process treatment using the fluorocarbon-like plasma 20, the fluorocarbon-like layer may remain in both sides of the data metal pattern 122 that are not covered by the first photoresist pattern PR1, and therefore may include $C_4F_8$, $C_4F_6$, $CHF_3$, or the like.

Figure 5G:
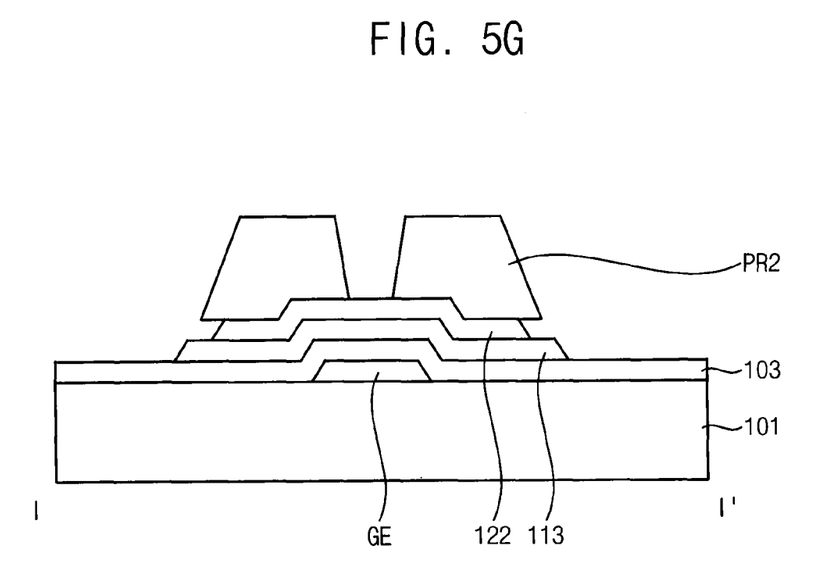

Referring to FIG. 5G, a second photoresist pattern PR2 is formed by partially removing the first photoresist pattern PR1. The second photoresist pattern PR2 may be formed by partially removing the first photoresist pattern PR1 in a thickness direction. As a result, a central portion of an upper surface of the data metal pattern 122 may become partially exposed by the second photoresist pattern PR2.

During the ashing process used to produce second photoresist pattern PR2, an outline of the second photoresist pattern PR2 may be maintained outside of the outline of the data metal pattern 122. Generally, in an ashing process of the first photoresist pattern PR1, the outline of the second photoresist pattern PR2 is moved and an under-cut may be formed in the second photoresist pattern PR2. However, according to the present example embodiment, since the first photoresist pattern PR1 has been previously treated by the pre-process fluorocarbon-like plasma 20 treatment, the outline of the second photoresist pattern PR2 may be maintained during the ashing process that produces second photoresist pattern PR2 from first photoresist pattern PR1.

Figure 5H:
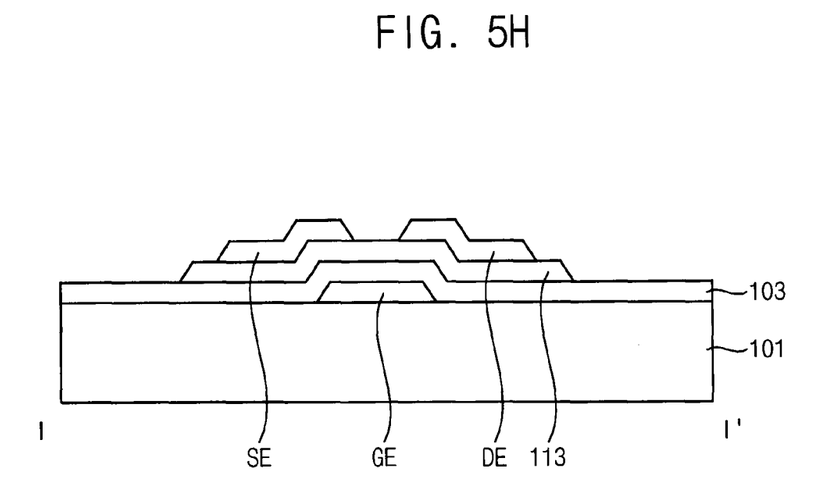

Referring now to FIG. 5H, the data metal pattern 122 is etched using the second photoresist pattern PR2 as an etch mask. As a result, an exposed central portion of the data metal pattern 122 is removed, so that source and drain electrodes SE and DE may be produced. During this etching process, an outline of the second photoresist pattern PR2 may again be maintained, so that the source electrode SE and the drain electrode DE may have proper width and skewness. Subsequent to the etching process that forms the source electrode SE and the drain electrode DE, the second photoresist pattern PR2 is removed altogether to produce the structure illustrated in FIG. 5H.

Figure 5I:
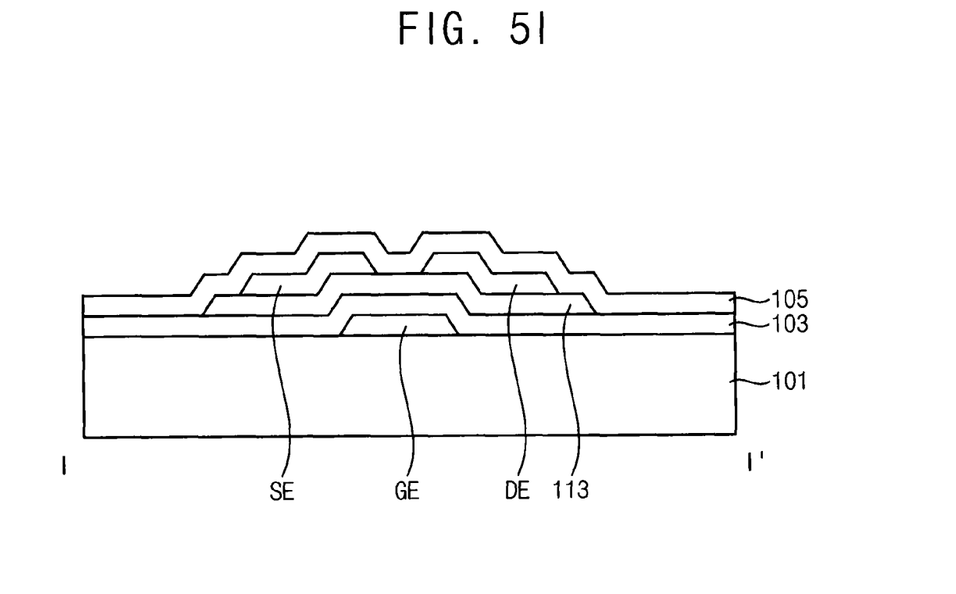

Referring now to FIG. 5I, an insulation layer 105 is formed on the base substrate 101 on which the source electrode SE and the drain electrode DE are formed to complete the process of forming the thin film transistor substrate. The insulation layer 105 may generally cover the source electrode SE and the drain electrode DE.

According to the exemplary embodiments of the present inventive concept, the pre-process plasma treatment of the active pattern or the active layer using the fluorocarbon-like plasma is performed before an etch back process of the photoresist pattern. Thus, an under-cut of the photoresist pattern due to an etchback process may be prevented, so that patterning characteristics of the source and drain electrodes in a subsequent process may be improved. In addition to the use of the fluorocarbon-like plasma pre-process treatment, the present process uses only four masks to produce a thin film transistor, and the resultant thin-film transistor has improved dimensions and skewness.

The foregoing is illustrative of the inventive concept, and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined by the claims. In the claims, means-plus-function clauses are intended to cover the structures described herein as performing the recited function and not only structural equivalents but also equivalent structures.

Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A method of manufacturing a thin film transistor substrate comprising a thin film transistor, comprising:
providing a base substrate;
forming a gate electrode of the thin film transistor on the base substrate;
forming a gate insulation layer on the gate electrode;
sequentially forming an active layer comprising oxide semiconductor and a data metal layer on the gate insulation layer;
forming a first photoresist pattern on the data metal layer at a location overlapping the gate electrode, the first photoresist pattern having a smaller thickness at a portion that overlaps the gate electrode;
forming a data metal pattern by patterning the data metal layer by an etching process using the first photoresist pattern as an etch mask, wherein the data metal pattern is formed inside an outline of the first photoresist pattern due to an undercutting resulting from the etching process;
performing a pre-process treatment on the data metal pattern and the first photoresist pattern using a plasma to form a layer of material used in the plasma on an exposed portion of the first photoresist pattern, side surfaces of the data metal pattern, and portions of an upper surface of the active layer that are not covered by the data metal pattern;
forming an active pattern of the thin film transistor by patterning the active layer by an etching process using the first photoresist pattern as an etch mask;
forming a second photoresist pattern by partially removing the first photoresist pattern; and
forming source and drain electrodes by patterning the data metal pattern in an etching process using the second photoresist pattern as an etch mask,
wherein the active pattern has an outline substantially the same as the first photoresist pattern due to remaining material used in the plasma such that the active pattern is larger than the data metal pattern in a cross-section view along a width direction of the active pattern, and
wherein the layer of material used in the plasma is at least one material selected from the group consisting of $C_nF_{2n-k}$ (where both n and k are natural numbers with 2n−k>0) and $CHF_3$.

2. The method of claim 1, wherein the plasma is included on a surface of a portion of the active pattern.

3. The method of claim 1, wherein the plasma is included on at least a side surface of the source and drain electrodes.

4. A method of manufacturing a thin film transistor substrate comprising a thin film transistor, comprising:
providing a base substrate;
forming a gate electrode of the thin film transistor on the base substrate;
forming a gate insulation layer on the gate electrode;
sequentially forming an active layer comprising oxide semiconductor and a data metal layer on the gate insulation layer;
forming a first photoresist pattern on the data metal layer at a location overlapping the gate electrode, the first photoresist pattern having a smaller thickness at a portion that overlaps the gate electrode;
forming a data metal pattern by patterning the data metal layer by an etching process using the first photoresist pattern as an etch mask, wherein the data metal pattern is formed inside an outline of the first photoresist pattern due to an undercutting resulting from the etching process;
forming an active pattern of the thin film transistor by patterning the active layer by an etching process using the first photoresist pattern as an etch mask;
performing a pre-process treatment on the thin film transistor substrate on which the active pattern is formed by exposing the thin film transistor substrate to a plasma to form a layer of material used in the plasma on an exposed portion of the first photoresist pattern, side surfaces of the data metal pattern, and upper and side surfaces of the active layer that are not covered by the data metal pattern;

forming a second photoresist pattern by partially removing the first photoresist pattern; and forming source and drain electrodes by patterning the data metal pattern in an etching process using the second photoresist pattern as an etch mask, wherein the active pattern has an outline substantially the same as the first photoresist pattern and is larger than the data metal pattern in a cross-section view along a width direction of the active pattern, and wherein the layer of material used in the plasma is at least one material selected from the group consisting of $C_nF_{2n-k}$ (where n is a natural number and k is a natural number less than 2n) and $CHF_3$.

5. The method of claim 4, wherein some of the plasma remains on a surface of a portion of at least one of the active pattern, the source electrode and the drain electrode.

\* \* \* \* \*